United States Patent
Yen et al.

(10) Patent No.: US 7,341,461 B1
(45) Date of Patent: Mar. 11, 2008

(54) MEMORY CARD ADAPTER

(75) Inventors: Ming Hui Yen, Taipei Hsien (TW); Chien Hsun Chu, Taipei Hsien (TW)

(73) Assignee: Chant Sincere Co., Ltd., Taipei Hsien (TW)

( * ) Notice: Subject to any disclaimer, the term of this patent is extended or adjusted under 35 U.S.C. 154(b) by 0 days.

(21) Appl. No.: 11/522,378

(22) Filed: Sep. 18, 2006

(51) Int. Cl.
*H05K 1/00* (2006.01)

(52) U.S. Cl. .................. 439/76.1; 439/630; 439/945

(58) Field of Classification Search ............ 439/76.1, 439/630, 945, 946
See application file for complete search history.

(56) References Cited

U.S. PATENT DOCUMENTS

| | | | |
|---|---|---|---|
| 6,219,256 B1 * | 4/2001 | Wu | 361/801 |
| 6,276,944 B1 * | 8/2001 | Klatt | 439/76.1 |
| 6,561,851 B2 * | 5/2003 | Florescu | 439/630 |
| 6,574,112 B2 * | 6/2003 | Washino et al. | 361/752 |
| 6,932,623 B2 * | 8/2005 | Lai | 439/76.1 |
| 7,059,910 B1 * | 6/2006 | Chang | 439/630 |
| 7,121,846 B2 * | 10/2006 | Katayanagi | 439/76.1 |
| 2005/0148245 A1 * | 7/2005 | Tsai | 439/630 |
| 2006/0223376 A1 * | 10/2006 | Chang et al. | 439/630 |
| 2006/0223377 A1 * | 10/2006 | Chang et al. | 439/630 |

* cited by examiner

*Primary Examiner*—Gary F. Paumen
(74) *Attorney, Agent, or Firm*—Bacon & Thomas, PLLC

(57) ABSTRACT

A memory card adapter is disclosed to include a connecting substrate with metal contacts, a multi-in-one memory card connector bonded to the connecting substrate for receiving one of a set of memory cards, a connecting terminal set, which has a plurality of metal terminals mounted in an electrically insulative terminal holder block with a rear bonding end of each metal terminal respectively bonded to the metal contacts of the connecting substrate and a front bonding ends for bonding to a PC board, a PC board, which has an electric connector at one end for connection to a notebook computer or the like and a plurality of metal contacts respectively bonded to the front bonding ends of the metal terminals of the connecting terminal set, and an electrically insulative housing, which has a rectangular frame that accommodates the connecting substrate and the PC board and two cover shells respectively covered on top and bottom sides of the rectangular frame over the connecting substrate and the PC board.

6 Claims, 6 Drawing Sheets

MEMORY CARD ADAPTER

BACKGROUND OF THE INVENTION (a) Field of the Invention

The present invention relates to a memory card adapter and more particularly, to such an improved structure of memory card adapter for express card slot of a notebook computer.

(b) Description of the Prior Art

A conventional memory card adapter for express card slot is known comprised of a multi-in-one memory card slot, a PC board, a connecting port, and an electrically insulative housing. Due to the limitation of the express card thickness to be within 5 mm, an elevation difference exists between the multi-in-one memory card slot and the connecting port at the PC board. To overcome this elevation difference, the electric connection between the multi-in-one memory card slot and the PC board is achieved by means of arranging curved metal terminals in the multi-in-one memory card slot and soldering the curved metal terminals to respective metal contacts at the PC board. However, it is difficult to accurately arrange the curved metal terminals in a limited space within a limited height inside the multi-in-one memory card slot. A small positioning error of the curved metal terminals in the multi-in-one memory card slot will result in an electric connection error. In consequence, the processing and installation of the curved metal terminals are complicated, resulting in a high manufacturing cost of the memory card adapter.

Therefore, it is desirable to provide a memory card adapter that eliminates the aforesaid problems.

SUMMARY OF THE INVENTION

The present invention has been accomplished under the circumstances in view. According to one aspect of the present invention, the memory card adapter is comprised of a connecting substrate, a memory card connector, a connecting terminal set, a PC board, and an electrically insulative housing, wherein the connecting substrate and the connecting terminal set constitute a bridge to electrically connect the memory card connector and the PC board, thereby simplifying the installation of metal terminals and achieving the effects of increasing the yield rate and lowering the cost. According to another aspect of the present invention, the electrically insulative housing has a rectangular frame with two locating holes and two cove shells covered on the top and bottom sides of the rectangular frame, and the PC board has an electric connector, which has two locating blocks respectively engaged into the locating holes of the rectangular frame of the electrically insulative housing to secure the printed circuit board to the rectangular frame of the electrically insulative housing.

DETAILED DESCRIPTION OF THE PREFERRED EMBODIMENTS

Figure 1:
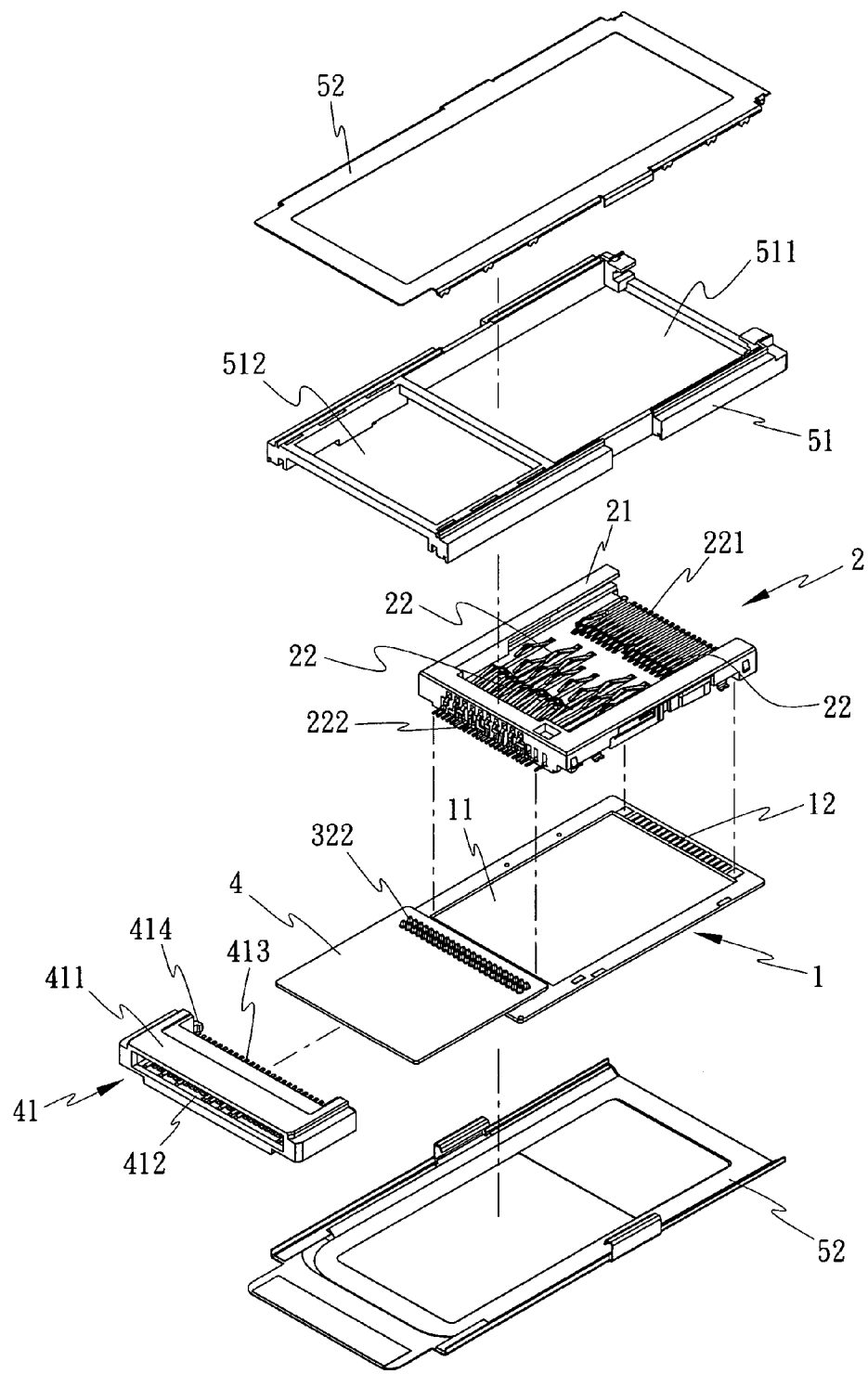
FIG. 1 is an exploded view of a memory card adapter in accordance with the present invention.
Figure 2:
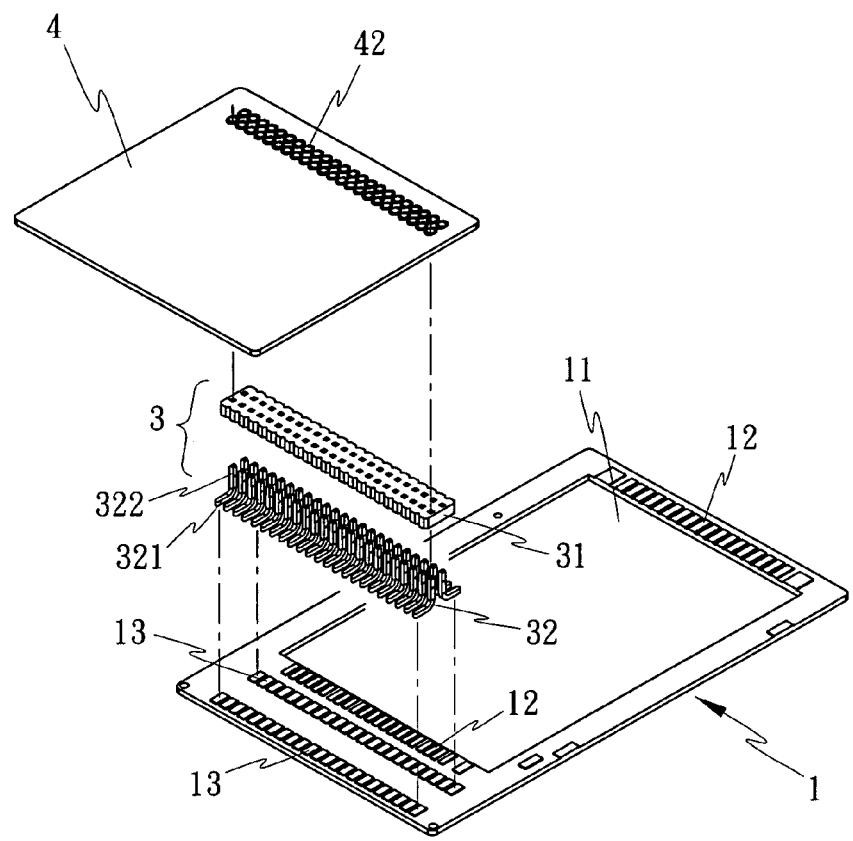
FIG. 2 is an exploded view of the connecting substrate, connecting terminal set and PC board of the memory card adapter according to the present invention.
Figure 3:
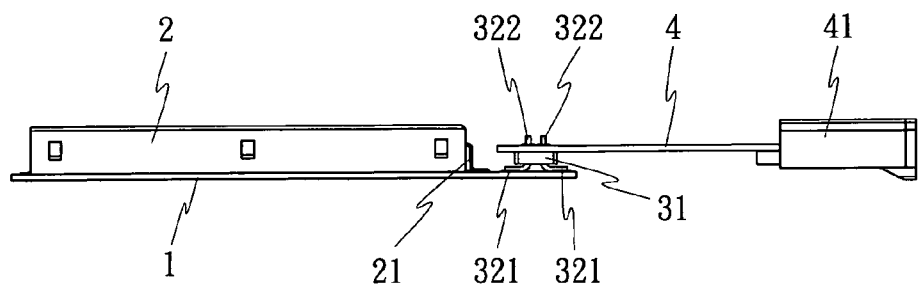
FIG. 3 is a side view of a part of the present invention, showing the connection between the connecting substrate and the PC board.
Figure 4:
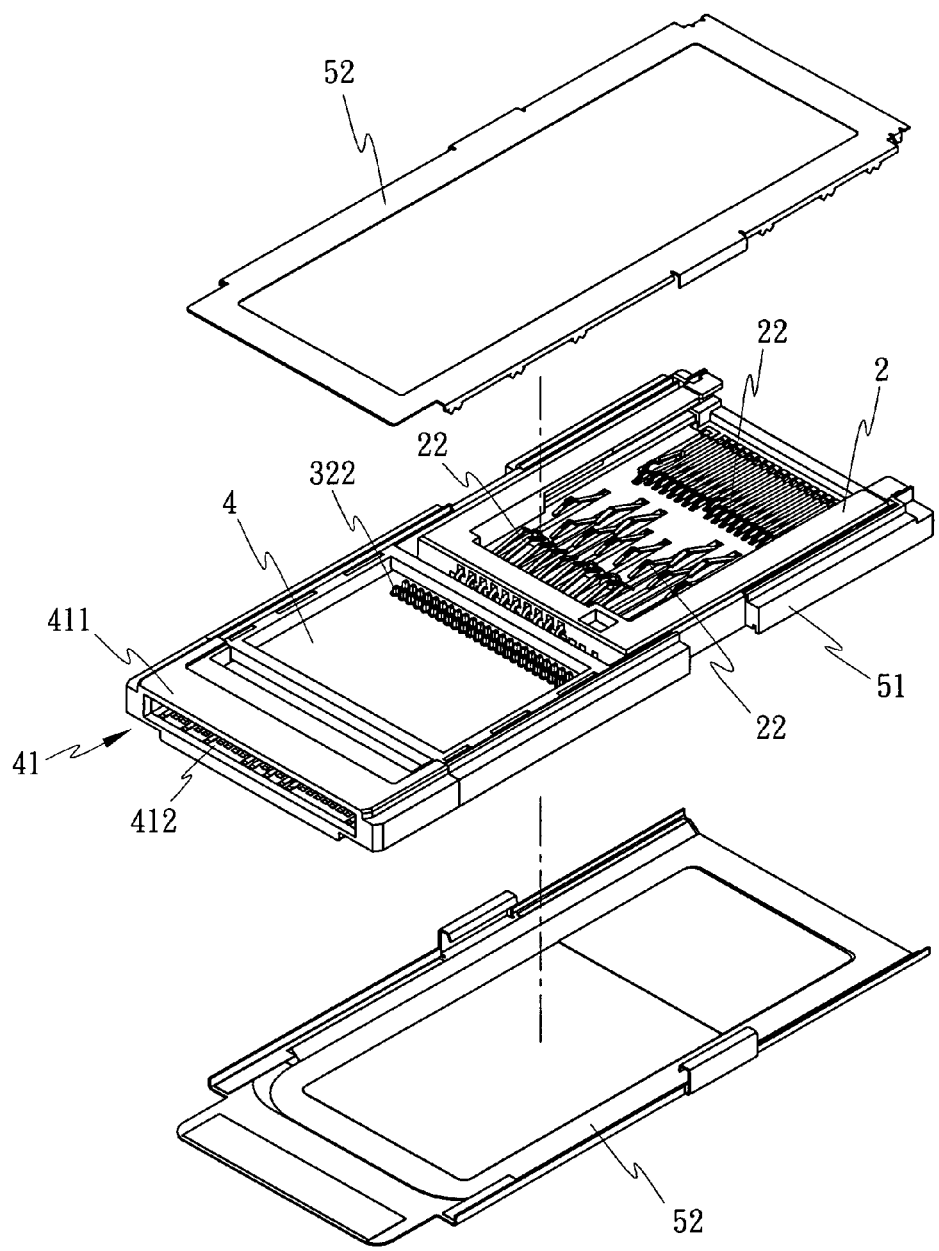
FIG. 4 is an exploded view of the present invention, showing the parts of the memory card adapter assembled before mounting of the cover shells of the electrically insulative housing.
Figure 5:
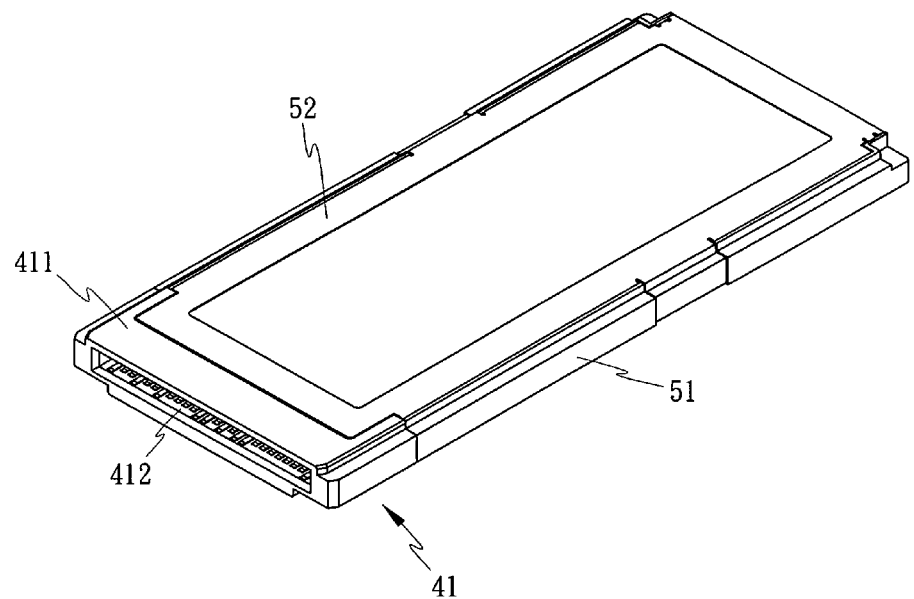
FIG. 5 is an oblique elevation of the memory card adapter according to the present invention.
Figure 6:
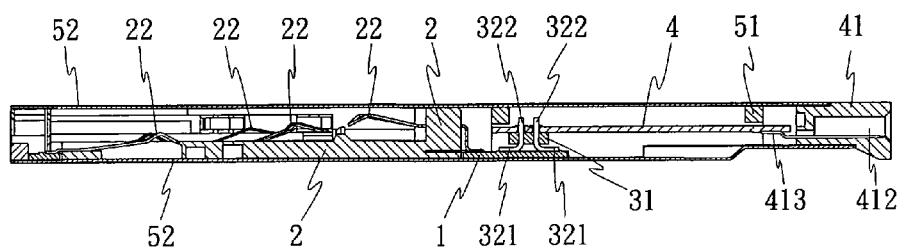
FIG. 6 is a longitudinal sectional view of the memory card adapter according to the present invention.
Figure 7:
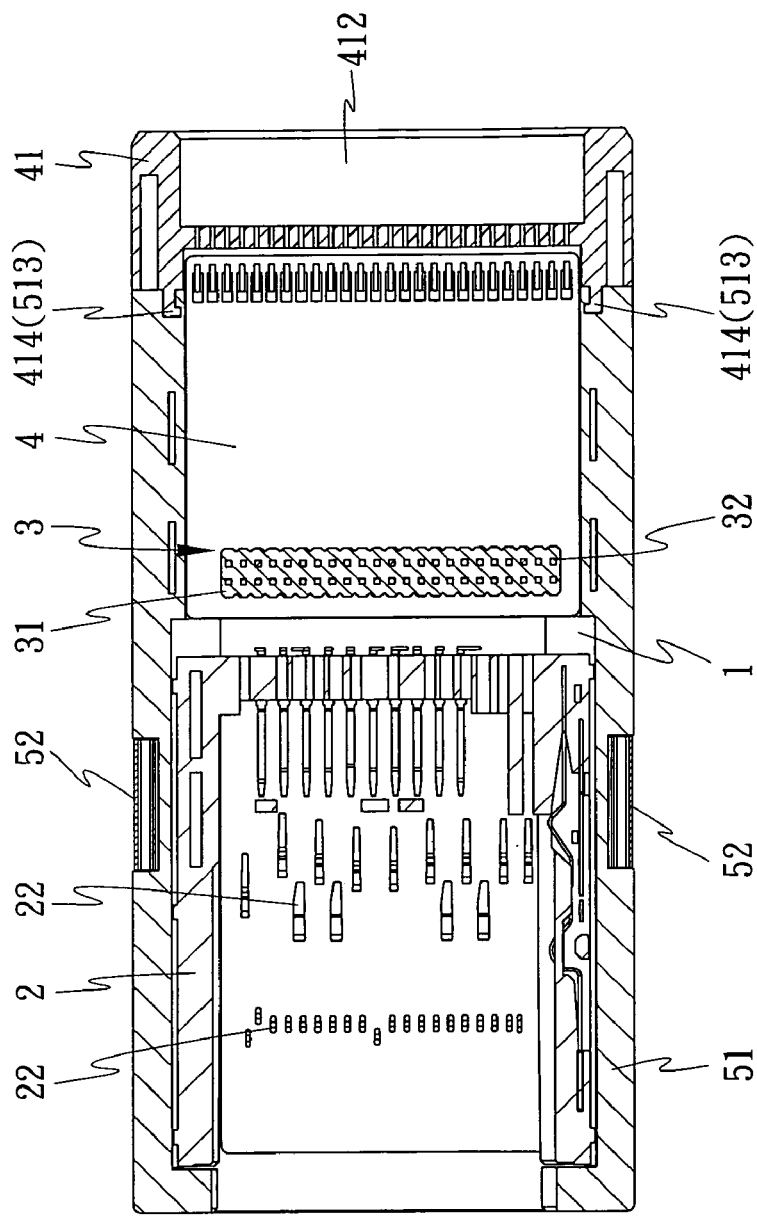
FIG. 7 is a top view of the memory card adapter according to the present invention.

Referring to FIGS. 1~8, a memory card adapter in accordance with the present invention is shown comprised a connecting substrate 1, a memory card connector 2, a connecting terminal set 3, a PC board 4, and an electrically insulative housing. Referring to FIGS. 1~3, the connecting substrate 1 has a window opening 11, and a plurality of metal contacts 12 and 13 arranged on the front and rear sides of the window opening 11 and electrically connected with printed circuits (not shown) subject to a predetermined layout for the connection of the memory card connector 2 and the connecting terminal set 3.

Referring to FIGS. 1 and 3, the memory card connector 2 is a multi-in-one card connector mounted on the connecting substrate 1 over the window opening 11, having an electrically insulative connector body 21 and multiple sets of metal terminals 22 arranged in the electrically insulative connector body 21 for the connection of MS (Memory Stick), XD (Extreme Digital), MMC (MultiMedia Card), or SD (SecureDigital Memory Card). The bonding ends 221 and 222 of the metal terminals 22 are respectively soldered to the metal contacts 12 of the connecting substrate 1 to electrically connecting the inserted memory card to the printed circuits of the connecting substrate 1.

The connecting terminal set 3 comprises an electrically insulative terminal holder block 31 and a plurality of metal terminals 32 mounted in the electrically insulative terminal holder block 31. The metal terminals 32 each have a rear bonding end 321 and a front bonding end 322. The rear bonding ends 321 of the metal terminals 32 are respectively soldered to the metal contacts 13 of the connecting substrate 1. The front bonding ends 322 are respectively soldered to respective metal contacts 42 of the PC board 4.

Referring to FIGS. 1~3, the PC board 4 has arranged thereon a circuit layout carrying a controller (control chip), activator, and other necessary electronic devices (because the circuit layout is of the known art and not within the scope of the claims of the present invention, no further detailed description in this regard is necessary). The PC board 4 has an electric connector 41 disposed at one end for connection to a notebook computer or any of a variety of other electronic apparatus. The electric connector 41 comprises an electrically insulative housing 411 and a plurality of metal terminals 413 mounted in respective terminal slots 412 in the electrically insulative housing 411 and electrically soldered to the PC board 4. The PC board 4 further has a plurality of metal contacts 42 to which the front bonding ends 322 of the metal terminals 32 are soldered.

Referring to FIGS. 4~7 and FIG. 1 again, the electrically insulative housing of the memory card adapter is comprised of a rectangular frame 51 and two cover shells 52. The rectangular frame 51 has two accommodation spaces 511 and 512 that accommodate the connecting substrate 1 and the PC board 4 respectively, keeping the receiving side of the memory card connector 2 and the connection side of the electric connector 41 respectively protruded over two opposite ends of the electrically insulative housing. The two cover shells 52 are respectively fastened to the top and bottom sides of the rectangular frame 51 and covered over the connecting substrate 1 and the PC board 4.

As stated above, the memory card connector 2 is mounted on the connecting substrate 1 over the window opening 11 with the bonding ends 221 and 222 of the metal terminals 22 thereof respectively soldered to the metal contacts 12 of the connecting substrate 1; the connecting substrate 1 with the memory card connector 2 are mounted in the accommodation space 511 of the rectangular frame 51; the PC board 4 with the electric connector 41 are mounted in the accommodation space 512 of the rectangular frame 51. Further, electric connection between the connecting substrate 1 and the PC board 4 is achieved by soldering the rear bonding ends 321 and front bonding ends 322 of the metal terminals 32 to the metal contacts 13 of the connecting substrate 1 and the metal contacts 42 of the PC board 4 respectively. Thus, the connecting substrate 1 and the connecting terminal set 3 constitute a bridge to electrically connect the memory card connector 2 and the PC board 4 together, thereby eliminating the elevational difference and circuit layout problems. The memory card adapter thus made is connectable to a notebook computer or the like to receive one of a set of memory cards including MS (Memory Stick), XD (Extreme Digital), MMC (MultiMedia Card), and SD (SecureDigital Memory Card) for data access.

Figure 8:
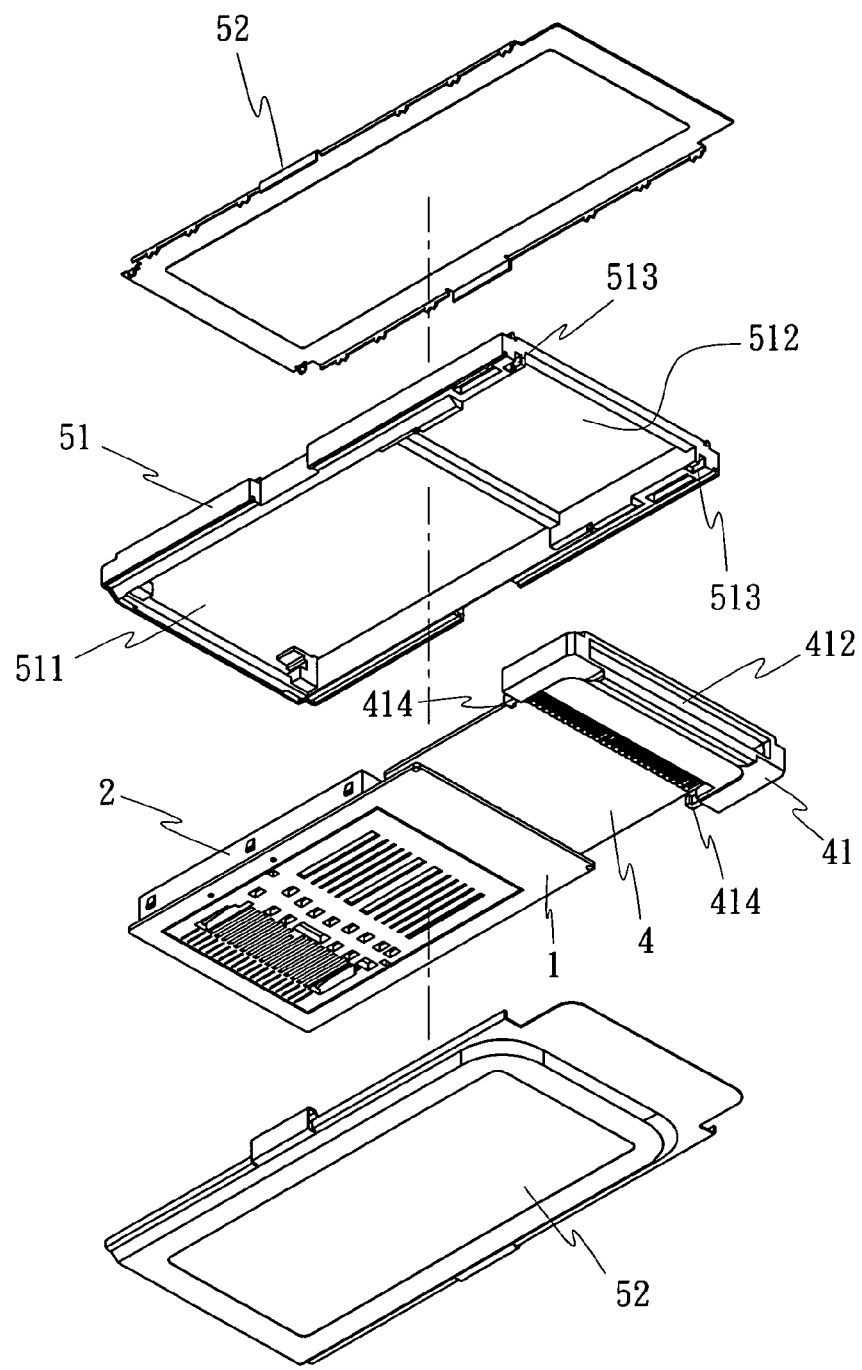
FIG. 8 is another exploded view of the memory card adapter according to the present invention.

Referring to FIG. 8, the electric connector 41 of the PC board 4 has two locating blocks 414 respectively engaged into respective locating holes 513 on the rectangular frame 51 to secure the PC board 4 to the accommodation space 512 of the rectangular frame 51 firmly.

A prototype of memory card adapter has been constructed with the features of FIGS. 1~8. The memory card adapter functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A memory card adapter comprising:
  a connecting substrate, said connecting substrate having a plurality of metal contacts;
  a multi-in-one memory card connector bonded to said connecting substrate for receiving one of a set of memory cards;
  a connecting terminal set, said connecting terminal set comprising an electrically insulative terminal holder block and a plurality of metal terminals mounted in said electrically insulative terminal holder block, the metal terminals of said connecting terminal set each having a rear bonding end respectively bonded to the metal contacts of said connecting substrate and a front bonding end for bonding to a printed circuit board;
  a printed circuit board, said printed circuit board comprising an electric connector disposed at one end thereof for connection to an external electronic apparatus, and a plurality of metal contacts respectively bonded to the front bonding ends of the metal terminals of said connecting terminal set; and
  an electrically insulative housing, said electrically insulative housing comprising a rectangular frame and two cover shells, said rectangular frame defining two accommodation spaces that accommodate said connecting substrate and said printed circuit board to have said memory card connector and the electric connector of said printed circuit board respectively partially protrude over two opposite ends of said electrically insulative housing.

2. The memory card adapter as claimed in claim 1, wherein said connecting substrate has a window opening; said multi-in-one memory card connector is soldered to said connecting substrate and bridging said window opening.

3. The memory card adapter as claimed in claim 1, wherein said multi-in-one memory card connector has a plurality of metal terminals, the metal terminals of said multi-in-one memory card connector each having a bonding end respectively soldered to the metal contacts of said connecting substrate.

4. The memory card adapter as claimed in claim 1, wherein the electric connector of said printed circuit board is electrically connectable to an electric connector of a notebook computer.

5. The memory card adapter as claimed in claim 1, wherein the rectangular frame of said electrically insulative housing has two locating holes symmetrically disposed at two opposite lateral sides; the electric connector of said printed circuit board has two locating blocks respectively engaged into the locating holes of the rectangular frame of said electrically insulative housing to secure said printed circuit board to the rectangular frame of said electrically insulative housing.

6. The memory card adapter as claimed in claim 1, wherein the two cover shells of said electrically insulative housing respectively cover top and bottom sides of said rectangular frame over said connecting substrate and said printed circuit board.

* * * * *